United States Patent
Eun et al.

(10) Patent No.: US 7,629,796 B2
(45) Date of Patent: Dec. 8, 2009

(54) CONTACT TYPE SINGLE SIDE PROBE DEVICE AND APPARATUS AND METHOD FOR TESTING OPEN OR SHORT CIRCUITS OF CONDUCTIVE LINES USING THE SAME

(75) Inventors: Tak Eun, Gyeonggi-do (KR); Seong Jin Kim, Seoul (KR); Hee Dok Choi, Incheon (KR); Dong Jun Lee, Seoul (KR); Dae Woong Song, Seoul (KR)

(73) Assignee: Microinspection, Inc., Seoul (KR)

( * ) Notice: Subject to any disclaimer, the term of this patent is extended or adjusted under 35 U.S.C. 154(b) by 216 days.

(21) Appl. No.: 11/826,145

(22) Filed: Jul. 12, 2007

(65) Prior Publication Data

US 2008/0018338 A1 Jan. 24, 2008

(30) Foreign Application Priority Data

Jul. 20, 2006 (KR) ...................... 10-2006-0068230

(51) Int. Cl.
*G01R 15/12* (2006.01)
(52) U.S. Cl. .................. 324/537; 324/555; 324/72.5
(58) Field of Classification Search .................. 324/509, 324/555, 72.5
See application file for complete search history.

(56) References Cited

U.S. PATENT DOCUMENTS

| 4,262,254 | A | * | 4/1981 | Poss | 324/457 |
| 4,656,416 | A | * | 4/1987 | Brasfield | 324/527 |
| 6,812,685 | B2 | * | 11/2004 | Steber et al. | 324/72.5 |
| 6,825,673 | B1 | * | 11/2004 | Yamaoka | 324/537 |
| 2006/0132151 | A1 | | 6/2006 | Wang | |

FOREIGN PATENT DOCUMENTS

JP  A 62-21069  1/1987

* cited by examiner

*Primary Examiner*—Vincent Q Nguyen
(74) *Attorney, Agent, or Firm*—Oliff & Berridge, PLC

(57) ABSTRACT

Disclosed herein are an apparatus and method for testing open and short circuits of conductive lines. A probe is brought into contact with one end of each of the conductive lines, AC power is applied, and the conductive lines are tested using electrical variations measured in the probe. By using a single-side probe device, it is possible to remarkably reduce the number of probes when the open or short circuit of a PCB pattern, a data transmission line or an electrical cable is tested and to remarkably reduce time or labor necessary for testing the open or short circuit. Since the measurement is performed only at one end of the conductive line to test the open or short circuit of the conductive line, it is possible to self-diagnose the open or short circuit when a single-side probe device is mounted in an input/output port of an electrical device.

17 Claims, 4 Drawing Sheets

CONTACT TYPE SINGLE SIDE PROBE DEVICE AND APPARATUS AND METHOD FOR TESTING OPEN OR SHORT CIRCUITS OF CONDUCTIVE LINES USING THE SAME

BACKGROUND OF THE INVENTION

1. Field of the Invention

The present invention relates to a contact type single-side probe device and an apparatus and method for testing open or short circuits of conductive lines using the same, and more particularly to a contact type single-side probe device which brings a probe into contact with one end of each of a plurality of conductive lines including a PCB pattern, a data transmission line and an electrical cable, applies AC power to the conductive lines, and tests the open and short circuits of the conductive lines using electrical variation values measured by the probe, and an apparatus and method for testing the open and short circuits of conductive lines using the same.

2. Description of the Related Art

In general, in order to test an open or short circuit of a multi-line cable such as a data transmission line, the cable is separated from the other circuits and resistance between the both ends of the cable is measured. At this time, at least two operators are necessarily required. If the number of lines of the cable is large, the line number may be forgotten. Accordingly, since repetitive checking may be required, reliability deteriorates and an operation time increases.

In order to detect open and short circuits of transparent electrodes of a flat panel display device such as a liquid crystal display (LCD) or a plasma display panel (PDP), as shown in FIG. 1, current is applied to one end of each of conductive lines 10 and a voltage is measured at the other end of each of the conductive lines 10, thereby testing the open and short circuits of the conductive lines 10. Alternatively, the conductive lines may be examined using a microscope to detect the open and short circuits of the conductive lines.

In order to test the open and short circuits of the conductive lines, at least two probes are required. That is, since a large number of probes are required, cost increases. In addition, if the lengths of the conductive lines are large, at least two operators for checking the open and short circuits of the conductive lines at different positions are required and thus great deal of time and labor are required.

SUMMARY OF THE INVENTION

Therefore, the present invention has been made in view of the above problems, and it is an object of the present invention to provide a contact type single-side probe device which brings a probe into contact with one end of each of a plurality of conductive lines including a PCB pattern, a data transmission line and an electrical cable, applies AC power to the conductive lines, and tests the open and short circuits of the conductive lines using electrical variation values measured by the probe, and an apparatus and method for testing the open and short circuits of conductive lines using the same.

In accordance with an aspect of the present invention, the above and other objects can be accomplished by the provision of a contact type single-side probe device including: a probe which is brought into contact with a conductive line to be tested; a power feeding section which applies AC power to the probe; and a sensor which measures an electrical variation value of the probe.

Preferably, the power feeding section may include an AC current source for applying AC current, and the sensor may measure a variation in voltage.

Preferably, the power feeding section may include an AC voltage source for applying an AC voltage, and the sensor may measure a variation in current flowing between the AC voltage source and the probe.

Preferably, the power feeding section may include an AC voltage source for applying an AC voltage and an impedance element interposed between the AC voltage source and the probe, and the sensor may measure a variation in voltage.

Preferably, the impedance element may be a capacitor or a resistor.

Preferably, the impedance element may be of a variable capacity type.

In accordance with another aspect of the present invention, there is provided an apparatus for testing open and short circuits of conductive lines using a contact type single-side probe device, the apparatus including: the single-side probe device which brings a probe into contact with one end of each of the conductive lines; a storage section which stores an electrical variation value measured by the single-side probe device; a signal processing section which stores the electrical variation value measured by the single-side probe device in the storage section, and determines the open or short circuit by the electrical variation value measured by the single-side probe or determines the open or short circuit by comparing the electrical variation value measured by the single-side probe device with the electrical variation value stored in the storage section; a display section which displays the electrical variation value measured by the single-side probe device and an operation state of the signal processing section; and a key input section which selects the operation state of the signal processing section.

Preferably, the contact type single-side probe device may include a probe which is brought into contact with each of the conductive lines to be tested; a power feeding section which applies AC power to the probe; and a sensor which measures the electrical variation value of the probe.

Preferably, the power feeding section may include an AC current source for applying AC current, and the sensor may measure a variation in voltage.

Preferably, the power feeding section may include an AC voltage source for applying an AC voltage, and the sensor may measure a variation in current flowing between the AC voltage source and the probe.

Preferably, the power feeding section may include an AC voltage source for applying an AC voltage and an impedance element interposed between the AC voltage source and the probe, and the sensor may measure a variation in voltage.

Preferably, the impedance element may be a capacitor or a resistor.

Preferably, the impedance element may be of a variable capacity type.

In accordance with yet another aspect of the present invention, there is provided a method for testing open and short circuits of conductive lines using a contact type single-side probe device for bringing a probe into contact with one end of a conductive line, applying AC power, and measuring an electrical variation value of the probe, the method including: bringing the probe of the single-side probe device into contact with one end of each of a plurality of conductive lines having an identical length; applying the AC power; measuring the electrical variation value by the single-side probe device; and testing the open and short circuits of the conductive lines.

Preferably, if the measured electrical variation value is a voltage, it may be determined that a conductive line is open-circuited when an amplitude of the voltage increases and it may be determined that a conductive line is short-circuited when the amplitude of the voltage decreases.

Preferably, if the measured electrical variation value is current, it may be determined that a conductive line is open-circuited when an amplitude of the current decreases and it may be determined that a conductive line is short-circuited when the amplitude of the current increases.

In accordance with yet another aspect of the present invention, there is provided a method for testing open and short circuits of conductive lines using a contact type single-side probe device for bringing a probe into contact with one end of a conductive line, applying AC power, and measuring an electrical variation value of the probe, the method including: bringing the probe of the single-side probe device into contact with one end of each of a plurality of conductive lines formed on a circuit board and having different lengths; applying the AC power; storing the electrical variation values measured by the single-side probe device according to the conductive lines; measuring electrical variation values of another circuit board having an identical pattern in same order and comparing the measured electrical variation values with the stored electrical variation values; and testing the open and short circuits of the conductive lines.

Preferably, if the measured electrical variation value is a voltage, it may be determined that a conductive line is open-circuited when an amplitude of the voltage increases and it may be determined that a conductive line is short-circuited when the amplitude of the voltage decreases.

Preferably, if the measured electrical variation value is current, it may be determined that a conductive line is open-circuited when an amplitude of the current decreases and it may be determined that a conductive line is short-circuited when the amplitude of the current increases.

According to the present invention, since a probe of a contact type single-side probe device is brought into contact with one end of each of a plurality of conductive lines, AC power is applied, and the open and short circuits of the conductive lines are tested using electrical variation values measured in the conductive lines, it is possible to simultaneously test the open and short circuits by a single scanning process and to determine the open or short circuit although the measurement is performed only at one end of the conductive line.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
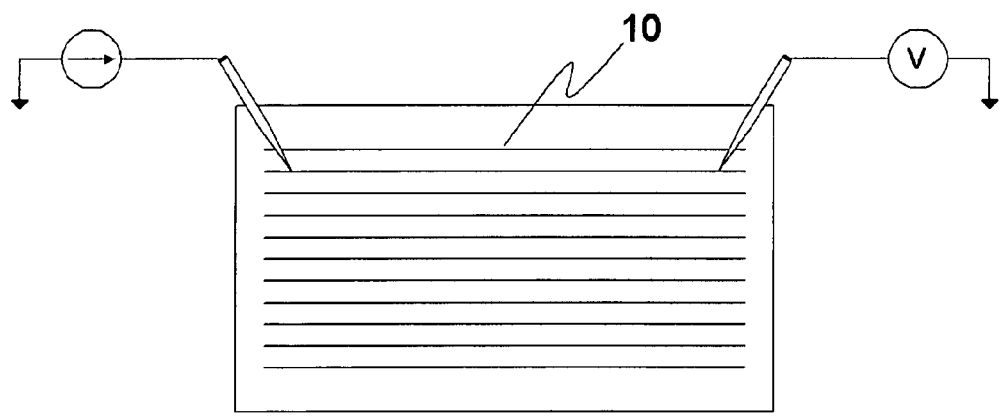
FIG. 1 is a view showing a general method of testing open and short circuits of conductive lines.

While the invention has been shown and described with respect to the preferred embodiments, it will be understood by those skilled in the art that various changes and modifications may be made without departing from the scope and spirit of the invention. Thus, the scope of the invention should not be limited by the embodiments of the present invention. The same portions as the prior art are denoted by same reference numerals and terms.

Figure 2:
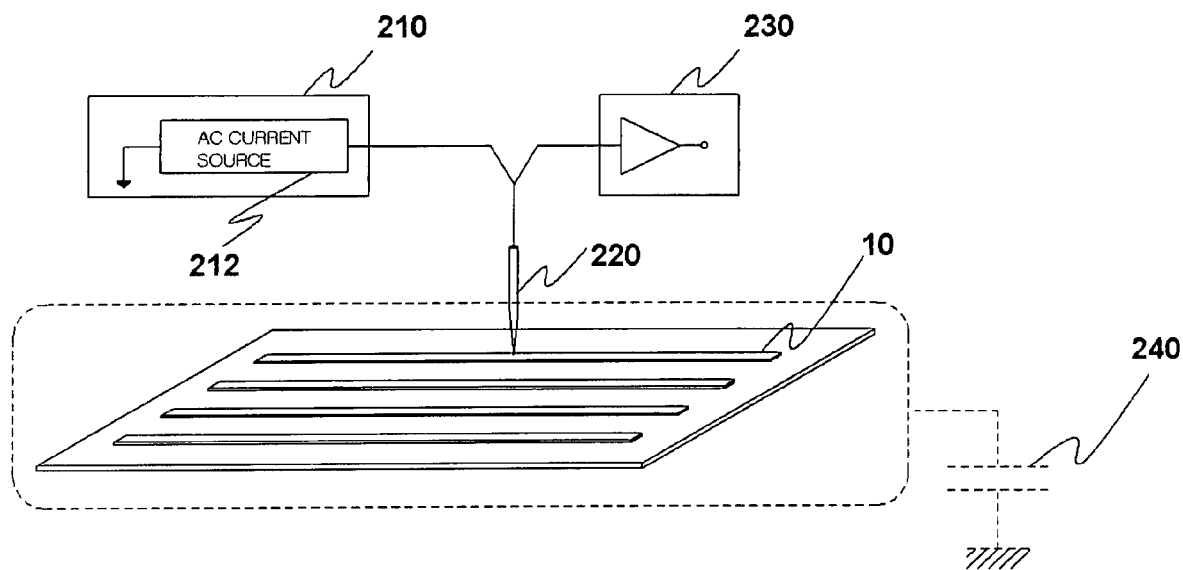
FIG. 2 is a view showing the configuration of a contact type single-side probe device according to a first embodiment of the present invention.

FIG. 2 is a view showing the configuration of a contact type single-side probe device according to a first embodiment of the present invention.

As shown, a contact type single-side probe device 20 according to the present embodiment includes a probe 220 which is in contact with each of conductive lines 10 to be tested, an AC current source 212 for applying AC current to the probe 220, and a sensor 230 for measuring a variation in voltage of the probe 220.

A power feeding section 210 includes the AC current source 212 for applying the AC current. The AC current source 212 applies the AC current to the probe 220 so as to check the open or short circuits of the conductive lines 10 via the variation in voltage measured in the probe 220.

Figure 3:
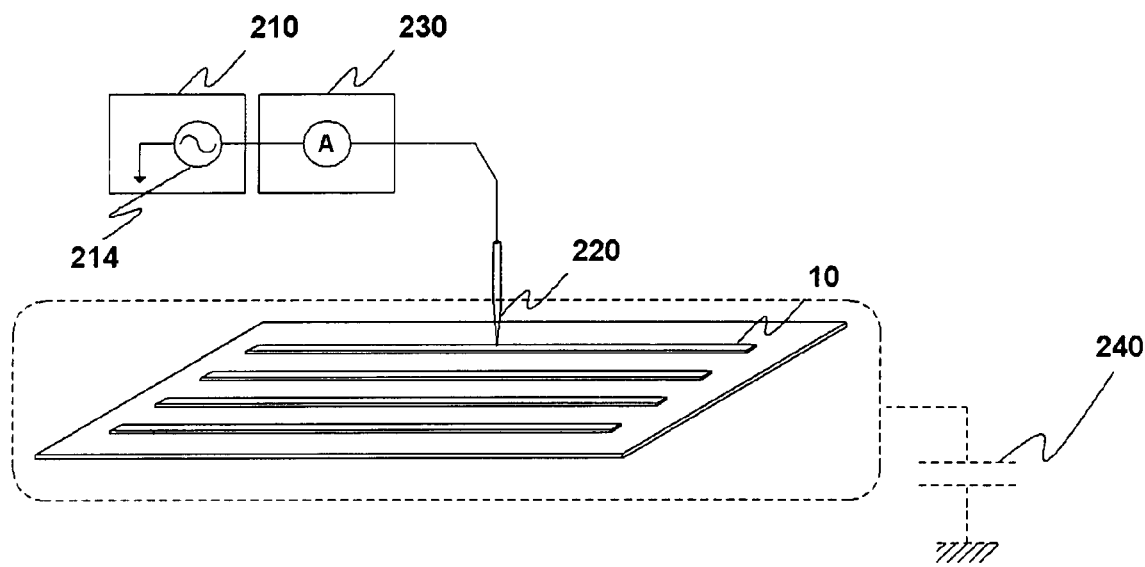
FIG. 3 is a view showing the configuration of a contact type single-side probe device according to a second embodiment of the present invention.

FIG. 3 is a view showing the configuration of a contact type single-side probe device according to a second embodiment of the present invention.

As shown, the contact type single-side probe device 20 according to the present embodiment includes a probe 220 which is in contact with each of conductive lines 10 to be tested, an AC voltage source 214 for applying an AC voltage to the probe 220, and a sensor 230 for measuring a variation in current flowing between the AC voltage source 214 and the probe 220.

A power feeding section 210 includes the AC voltage source 214. The variation in current flowing between the AC voltage source 214 and the probe 220 is measured so as to check the open or short circuits of the conductive lines 10.

Figure 4:
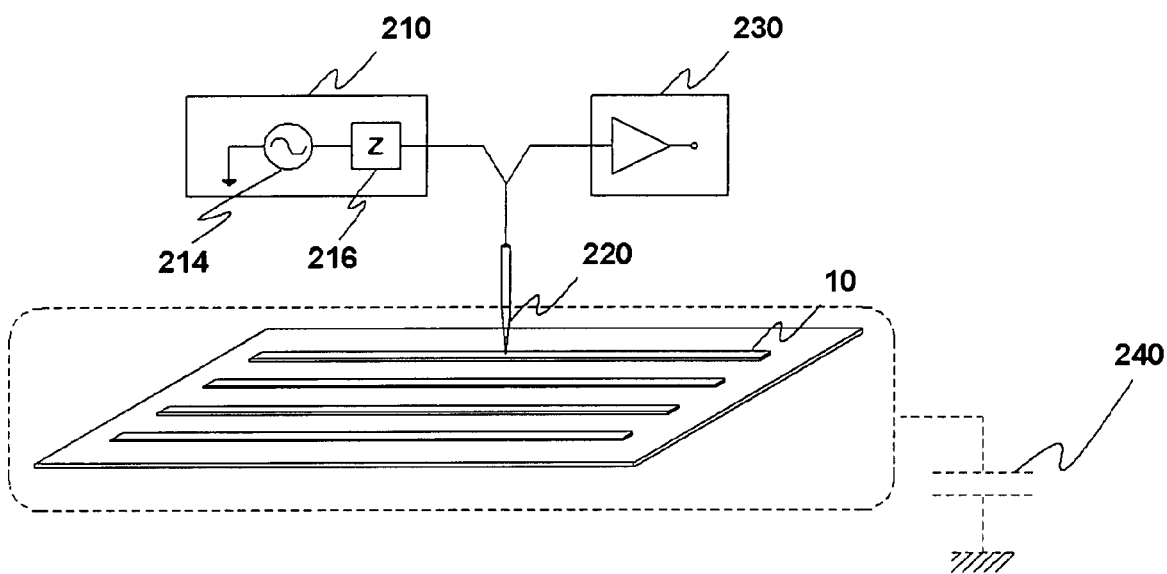
FIG. 4 is a view showing the configuration of a contact type single-side probe device according to a third embodiment of the present invention.

FIG. 4 is a view showing the configuration of a contact type single-side probe device according to a third embodiment of the present invention.

As shown, the contact type single-side probe device 20 according to the present embodiment includes a probe 220 which is in contact with each of conductive lines 10 to be tested, an AC voltage source 214 for applying an AC voltage to the probe 220, an impedance element 216 interposed between the AC voltage source 214 and the probe 220, and a sensor 230 for measuring a variation in voltage of the probe 220.

The impedance element 216 may include a capacitor or a resistor as a passive element and is preferably of a variable capacity type such that a remarkable electrical variation can be measured in correspondence with the surface areas of the conductive lines 10 to be tested.

Figure 5:
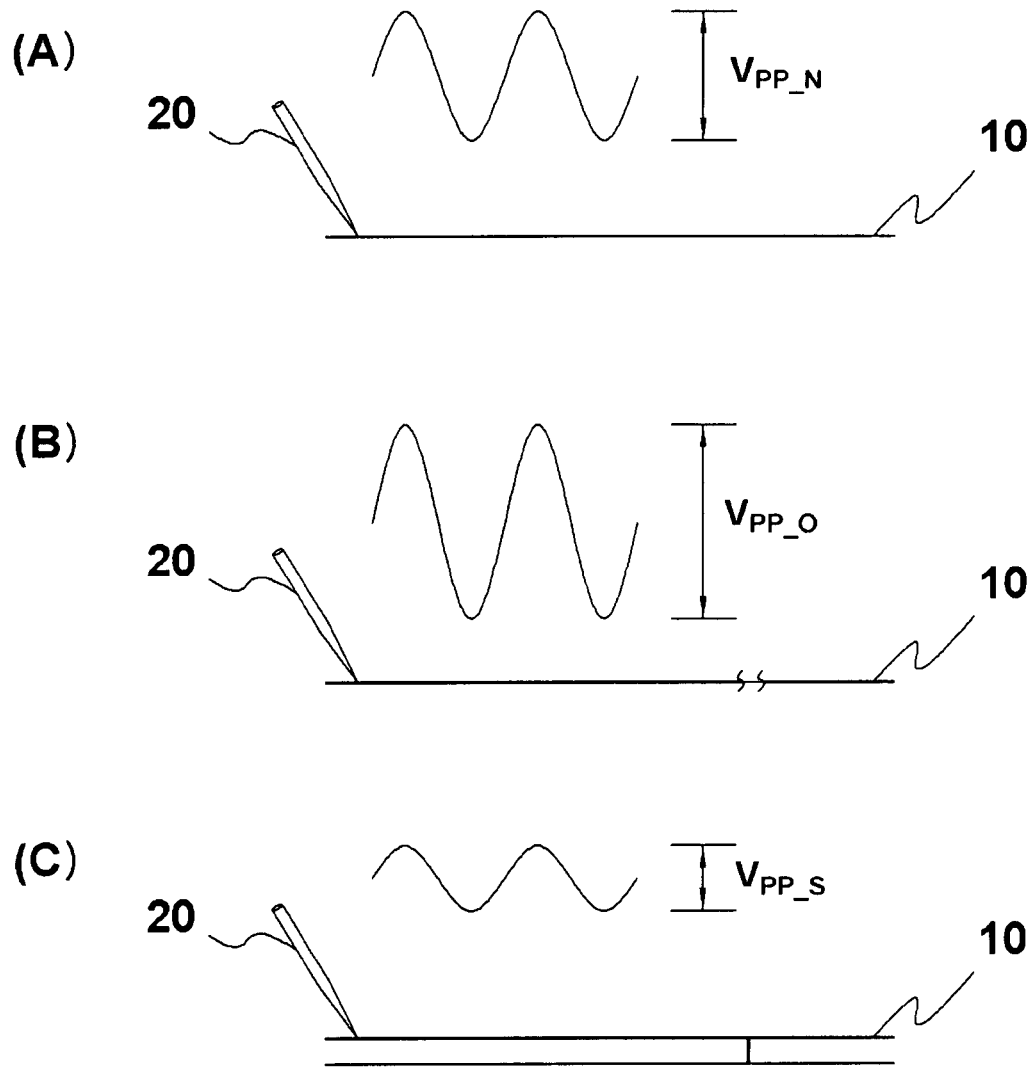
FIG. 5 is a view showing test waveforms measured when conductive lines having an identical length are tested using the contact type single-side probe device according to the present invention.

FIG. 5 is a view showing a voltage value measured when conductive lines 10 having an identical length are tested using the contact type single-side probe device 20 in which the power feeding section 210 includes the AC voltage source 214 and the impedance element 216.

That is, a case where the contact type single-side probe device 20 according to the present invention is brought into contact with one end of each of the conductive lines 10, the AC power is applied, and the voltage value is measured by a detected electrical variation will be described.

At this time, the voltage value of a normal conductive line 10 is $V_{PP\_N}$ as shown in FIG. 5A. If the conductive line 10 is open-circuited as shown in FIG. 5B, the electrode area of the conductive line 10 decreases and the capacitance of a parasitic capacitor 240 formed between the electrode area of the conductive line 10 and ambient ground in the vicinity of the conductive line 10 decreases. Accordingly, in this case, the measured voltage value of the conductive line 10 is $V_{PP\_O}$, which is larger than the voltage value $V_{PP\_N}$ of the normal conductive line 10.

Meanwhile, if the conductive line 10 is short-circuited to an adjacent conductive line 10 as shown in FIG. 5C, the electrode area of the conductive line 10 increases and the capacitance of the parasitic capacitor 240 formed between the electrode area of the conductive line 10 and ambient ground in the vicinity of the conductive line 10 increases. Accordingly, in this case, the measured voltage value of the conductive line 10 is $V_{PP\_S}$, which is smaller than the voltage value $V_{PP\_N}$ of the normal conductive line 10.

When the open or short circuits of the conductive lines 10 having an identical length are tested using the contact type single-side probe device 20, it is determined whether the voltage value detected in one end of the conductive line 10 varies. That is, if the voltage value increases, the conductive line 10 is determined to be open-circuited and, if the voltage value decreases, the conductive line 10 is determined to be short-circuited.

Although, in the present embodiment, the AC power of a sine wave is applied and the open or short circuit of the conductive line is determined by the variation in voltage, the open or short circuit of the conductive line may be determined using a rectangular wave (step form wave), an impulse wave, and a white noise.

Meanwhile, when the contact type single-side probe device 20 according to the present invention is provided in an input/output port of an electric device (not shown), the probe may be used to self-diagnose the open or short circuit in the connection to an internal circuit or another device.

Figure 6:
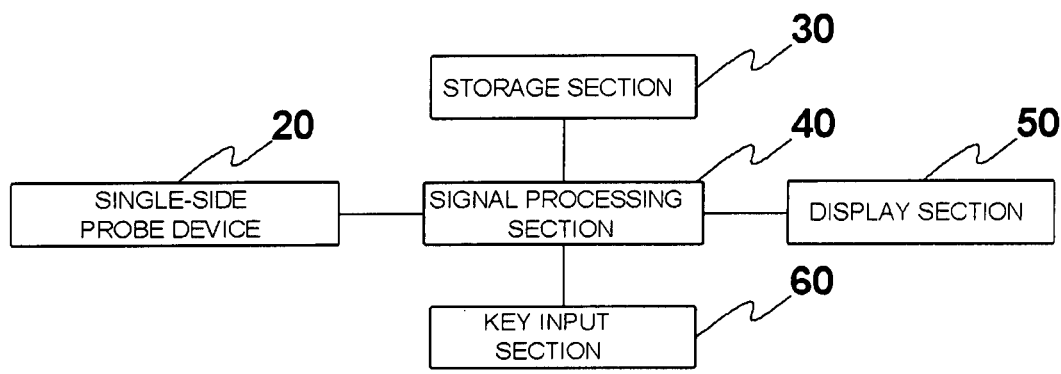
FIG. 6 is a block diagram showing an apparatus for testing open and short circuits of conductive lines using the contact type single-side probe device according to the present invention.

FIG. 6 is a block diagram showing an apparatus for testing open and short circuits of conductive lines using the contact type single-side probe device according to the present invention.

As shown, the apparatus includes a single-side probe device 20 for bringing the probe 220 into contact with one end of each of the conductive lines 10, applying the AC power, and measuring an electrical variation value of the probe 220, a storage section 30 for storing the electrical variation value measured by the single-side probe device 20, a signal processing section 40 for storing the electrical variation value measured by the single-side probe device 20 in the storage section 30 and determining the open or short circuit by the electrical variation value measured by the single-side probe device 20, or determining the open or short circuit by comparing the electrical variation value measured by the single-side probe device 20 with the electrical variation value stored in the storage section 30, a display section 50 for displaying the electrical variation value measured by the single-side probe device 20 and an operation state of the signal processing section 40, and a key input section 60 for selecting the operation state of the signal processing section 50.

In the apparatus for testing the conductive lines using the contact type single-side probe device, when a plurality of circuit boards 70 having an identical pattern are measured, although the lengths of the conductive lines 10 formed on one circuit board 70 are different, the measured electrical variation values are stored in the storage section 30 and are compared with the electrical variation values measured in the other circuit board 70 having the identical pattern to determine the electrical variation of the conductive line 10, thereby testing the open or short circuit.

Figure 7:
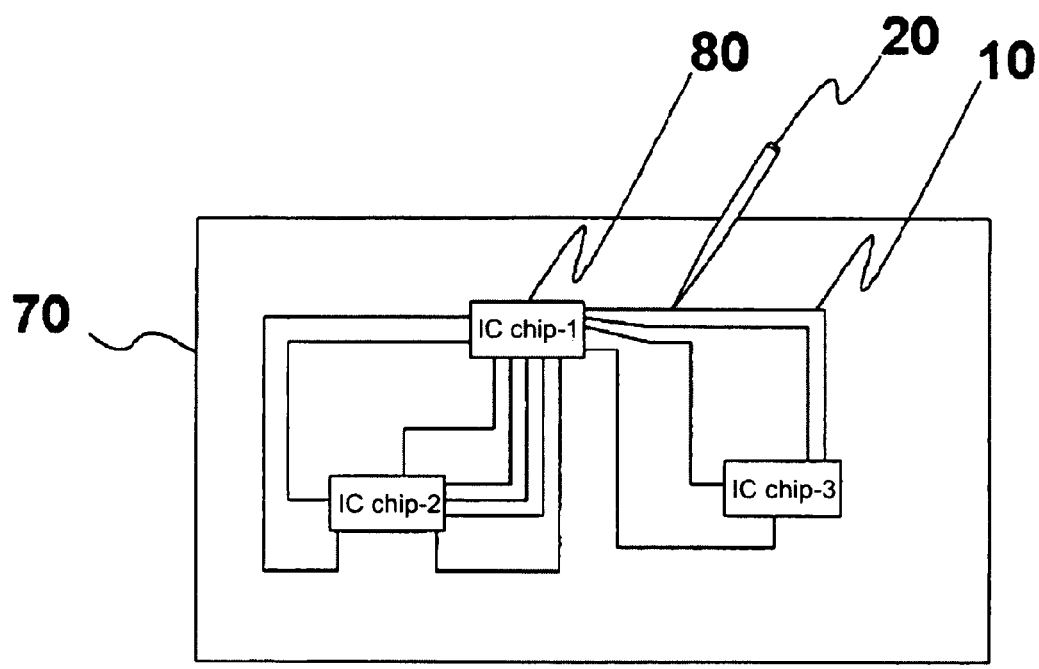
FIG. 7 is a view showing an example of testing open and short circuits of conductive lines formed on a circuit board and having different lengths, using the apparatus for testing the open and short circuits of the conductive lines using the contact type single-side probe device according to the present invention.

That is, as shown in FIG. 7, although the lengths of the conductive lines 10 connected to one IC chip-1 80 of a circuit board are different, the electrical variation values of the conductive lines 10 are sequentially measured using the single-side probe device 20 and are stored in the storage section 30, the electrical variation values of another circuit board 70 having the identical pattern are sequentially measured in same order and are compared with the electrical variation values which are previously stored in the storage section 30, thereby testing the open or short circuits of the conductive lines 10.

For example, when the voltage value is measured by the electrical variation value, the signal processing section 40 determines that the conductive line is short-circuited if the voltage value is smaller than the voltage value of the conductive line 10 measured repeatedly and displays the determined result on the display section 50. In contrast, the signal processing section 40 determines that the conductive line is open-circuited if the voltage value is larger than the voltage value of the conductive line 10 measured repeatedly and displays the determined result on the display section 50. When the voltage value is equal to the voltage value of the conductive line 10 measured repeatedly, the conductive line is determined to be a normal line. Accordingly, the open or short circuits of the conductive lines 10 having different lengths can be tested.

When the processed state of the signal processing section 40 is controlled through the key input section 60 such that the measured value is immediately displayed, a user may immediately check a variation in measured value through the display section 50 when the conductive lines 10 having the identical length are measured. The variations in measured value are stored in the storage section 30 and are compared to determine the open or short circuit.

As described above, since a probe is brought into contact with one end of each of a plurality of conductive lines including a PCB pattern, a data transmission line and an electrical cable, AC power is applied, and the open or short circuits of the conductive lines are tested using electrical variation values measured by the probe, it is possible to remarkably reduce the number of devices or operators compared with a case of using two probes.

Even when the length of a conductive line to be measured is large, one operator can test the open or short circuit. Accordingly, it is possible to perform a test by a small number of operators.

Since the measurement is performed only at one end of a conductive line to test the open or short circuit of the conductive line, it is possible to self-diagnose the open or short circuit when a single-side probe device is mounted in an input/output port of an electrical device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A contact type single-side probe device comprising:
   a probe which is brought into contact with a conductive line to be tested;
   a power feeding section which applies AC power to the probe; and
   a sensor which measures an electrical variation value of the probe, wherein
   the power feeding section includes an AC voltage source for applying an AC voltage and an impedance element interposed between the AC voltage source and the probe, and the sensor measures a variation in voltage.

2. The contact type single-side probe device according to claim 1, wherein the impedance element is a capacitor.

3. The contact type single-side probe device according to claim 1, wherein the impedance element is a resistor.

4. The contact type single-side probe device according to claim 1, wherein the impedance element is of a variable capacity type.

5. An apparatus for testing open and short circuits of conductive lines using a contact type single-side probe device, the apparatus comprising:
   the single-side probe device which brings a probe into contact with one end of each of the conductive lines;
   a storage section which stores an electrical variation value measured by the single-side probe device;
   a signal processing section which stores the electrical variation value measured by the single-side probe device in the storage section, and determines the open or short circuit by the electrical variation value measured by the single-side probe or determines the open or short circuit by comparing the electrical variation value measured by the single-side probe device with the electrical variation value stored in the storage section;
   a display section which displays the electrical variation value measured by the single-side probe device and an operation state of the signal processing section; and
   a key input section which selects the operation state of the signal processing section.

6. The apparatus according to claim 5, wherein the contact type single-side probe device includes:
   a probe which is brought into contact with each of the conductive lines to be tested;
   a power feeding section which applies AC power to the probe; and
   a sensor which measures the electrical variation value of the probe.

7. The apparatus according to claim 6, wherein the power feeding section includes an AC current source for applying AC current, and the sensor measures a variation in voltage.

8. The apparatus according to claim 6, wherein the power feeding section includes an AC voltage source for applying an AC voltage, and the sensor measures a variation in current flowing between the AC voltage source and the probe.

9. The apparatus according to claim 6, wherein the power feeding section includes an AC voltage source for applying an AC voltage and an impedance element interposed between the AC voltage source and the probe, and the sensor measures a variation in voltage.

10. The apparatus according to claim 9, wherein the impedance element is a capacitor.

11. The apparatus according to claim 9, wherein the impedance element is a resistor.

12. The apparatus according to claim 9, wherein the impedance element is of a variable capacity type.

13. A method for testing open and short circuits of conductive lines using a contact type single-side probe device for bringing a probe into contact with one end of a conductive line, applying AC power, and measuring an electrical variation value of the probe, the method comprising:
   bringing the probe of the single-side probe device into contact with one end of each of a plurality of conductive lines having an identical length;
   applying the AC power;
   measuring the electrical variation value by the single-side probe device; and
   testing the open or short circuits of the conductive lines, wherein,
   if the measured electrical variation value is a voltage, it is determined that a conductive line is open-circuited when an amplitude of the voltage increases and it is determined that a conductive line is short-circuited when the amplitude of the voltage decreases.

14. A method for testing open and short circuits of conductive lines using a contact type single-side probe device for bringing a probe into contact with one end of a conductive line, applying AC power, and measuring an electrical variation value of the probe, the method comprising:
   bringing the probe of the single-side probe device into contact with one end of each of a plurality of conductive lines having an identical length;
   applying the AC power;
   measuring the electrical variation value by the single-side probe device; and
   testing the open or short circuits of the conductive lines, wherein,
   if the measured electrical variation value is current, it is determined that a conductive line is open-circuited when an amplitude of the current decreases and it is determined that a conductive line is short-circuited when the amplitude of the current increases.

15. A method for testing open and short circuits of conductive lines using a contact type single-side probe device for bringing a probe into contact with one end of a conductive line, applying AC power, and measuring an electrical variation value of the probe, the method comprising:
   bringing the probe of the single-side probe device into contact with one end of each of a plurality of conductive lines formed on a circuit board and having different lengths;
   applying the AC power;
   storing the electrical variation values measured by the single-side probe device according to the conductive lines;
   measuring electrical variation values of another circuit board having an identical pattern in same order and comparing the measured electrical variation values with the stored electrical variation values; and
   testing the open or short circuits of the conductive lines.

16. The method according to claim 15, wherein, if the measured electrical variation value is a voltage, it is determined that a conductive line is open-circuited when an amplitude of the voltage increases and it is determined that a conductive line is short-circuited when the amplitude of the voltage decreases.

17. The method according to claim 15, wherein, if the measured electrical variation value is current, it is determined that a conductive line is open-circuited when an amplitude of the current decreases and it is determined that a conductive line is short-circuited when the amplitude of the current increases.

* * * * *